United States Patent
Xu et al.

(10) Patent No.: US 10,790,546 B2
(45) Date of Patent: Sep. 29, 2020

(54) CURRENT BYPASS DEVICE FOR PROTON EXCHANGE MEMBRANE FUEL CELL SYSTEM

(71) Applicant: FORD GLOBAL TECHNOLOGIES, LLC, Dearborn, MI (US)

(72) Inventors: Chunchuan Xu, Troy, MI (US); Jun Yang, Bloomfield Hills, MI (US); James Waldecker, Plymouth, MI (US); Feng Li, Troy, MI (US); George Saloka, Dearborn, MI (US); Mark Sulek, Sterling Heights, MI (US); Thomas P. Brackett, III, Dearborn, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 327 days.

(21) Appl. No.: 15/822,827

(22) Filed: Nov. 27, 2017

(65) Prior Publication Data
US 2019/0165427 A1    May 30, 2019

(51) Int. Cl.
| | |
|---|---|
| *H01L 25/18* | (2006.01) |
| *H01M 10/42* | (2006.01) |
| *H01M 8/04955* | (2016.01) |
| *H01M 8/04858* | (2016.01) |
| *H01M 8/04537* | (2016.01) |
| *B60K 1/04* | (2019.01) |
| *H02H 9/04* | (2006.01) |

(52) U.S. Cl.
CPC ........... *H01M 10/425* (2013.01); *B60K 1/04* (2013.01); *H01L 25/18* (2013.01); *H01M 8/04544* (2013.01); *H01M 8/04559* (2013.01); *H01M 8/04902* (2013.01); *H01M 8/04955* (2013.01); *H02H 9/041* (2013.01); *H01M 2250/20* (2013.01)

(58) Field of Classification Search
USPC .......................................... 429/13
See application file for complete search history.

(56) References Cited

U.S. PATENT DOCUMENTS

| | | | | |
|---|---|---|---|---|
| 6,096,449 A | * | 8/2000 | Fuglevand | H01M 8/04089 429/431 |
| 7,235,315 B2 | | 6/2007 | Knights et al. | |
| 8,962,166 B2 | | 2/2015 | Marsh | |
| 2005/0196656 A1 | | 9/2005 | Gomez | |
| 2006/0261347 A1 | * | 11/2006 | Ryu | H01L 29/66068 257/77 |
| 2007/0042243 A1 | * | 2/2007 | Bai | H01M 8/04067 320/101 |
| 2010/0003546 A1 | * | 1/2010 | Hochgraf | H01M 8/04231 429/438 |
| 2010/0190074 A1 | * | 7/2010 | Shimura | H01M 8/04298 429/432 |

* cited by examiner

*Primary Examiner* — Danny Nguyen
(74) *Attorney, Agent, or Firm* — David Kelley; Brooks Kushman P.C.

(57) ABSTRACT

A fuel cell system includes a plurality of fuel cells. Each of the fuel cells may include a current bypass device that is configured to flow a current responsive to an anode potential exceeding a cathode potential to prevent carbon corrosion within the fuel cell.

17 Claims, 3 Drawing Sheets

CURRENT BYPASS DEVICE FOR PROTON EXCHANGE MEMBRANE FUEL CELL SYSTEM

TECHNICAL FIELD

This application generally relates to preventing degradation of fuel cells during voltage reversal conditions.

BACKGROUND

Vehicles may be powered by fuel cell systems. A fuel cell system generates electrical energy by chemical reactions caused by circulating hydrogen and oxygen through a fuel cell stack. The fuel cell stack is comprised of cells. Under some conditions, one or more of the cells may experience a voltage reversal. The voltage reversal can cause a carbon corrosion within the fuel cell which can lead to performance degradation.

SUMMARY

A fuel cell includes an anode and a cathode, each having a corresponding bipolar plate. The fuel cell further includes at least one semiconductor switch having a gate terminal, and load terminals respectively electrically coupled to one of the bipolar plates. The fuel cell further includes a circuit configured to, responsive to a potential of the anode exceeding a potential of the cathode, bias the gate terminal to cause current to conduct between the bipolar plates through the semiconductor switch.

The semiconductor switch may be an insulated gate bipolar transistor (IGBT). The semiconductor switch may be a metal-oxide semiconductor field-effect transistor (MOSFET). The at least one semiconductor switch may be comprised of a plurality of semiconductor switching devices coupled in parallel. The at least one semiconductor switch may be configured to have a current density of at least 50 $A/cm^2$ in a conducting state The at least one semiconductor switch may be configured to have a voltage drop across the load terminals of no more than 0.1 Volts when the gate terminal is biased to cause current to conduct between the load terminals. The circuit may be powered by a voltage across the bipolar plates. The circuit may be further configured to bias the gate terminal to cause current flow through the semiconductor switch to be blocked responsive to the potential of the cathode exceeding the potential of the anode.

A fuel cell stack includes a plurality of fuel cells, each having an anode bipolar plate, a cathode bipolar plate, at least one semiconductor switching device, and a circuit configured to, responsive to an anode potential becoming greater than a cathode potential, bias a gate of the semiconductor switching device to conduct current from the anode bipolar plate to the cathode bipolar plate through the at least one semiconductor switching device.

The at least one semiconductor switching device may be configured to have a maximum current capability that is at least a rated operating current of the fuel cell stack. The circuit may be further configured to, responsive to the cathode potential becoming greater than the anode potential, bias the gate of the at least one semiconductor switching device to block current flow through the at least one semiconductor switching device. The at least one semiconductor switching device may be an insulated gate bipolar transistor (IGBT). The at least one semiconductor switching device may be a metal oxide semiconductor field-effect transistor (MOSFET). The at least one semiconductor switching device may be comprised of a plurality of semiconductor switching devices coupled in parallel. The circuit may be further configured to be powered by a voltage across the anode bipolar plate and the cathode bipolar plate.

A vehicle includes a fuel cell stack including a plurality of fuel cells, each of the fuel cells including at least one semiconductor switch and a circuit configured to, responsive to a potential of an anode becoming greater than a potential of a cathode, bias a gate of the at least one semiconductor switch to enter a conducting state to conduct current from the anode to the cathode of the corresponding fuel cell.

The circuit may be further configured to, responsive to the potential of the cathode becoming greater than the potential of the anode, bias the gate of the at least one semiconductor switch to enter a nonconducting state to block current flow through the at least one semiconductor switch. The at least one semiconductor switch may be configured to have a maximum current capability that is at least a rated operating current of the fuel cell stack. The circuit may be further configured to be powered by a voltage across the anode and cathode of the corresponding fuel cell. The at least one semiconductor switch may be comprised of a plurality of semiconductor switches arranged in parallel.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
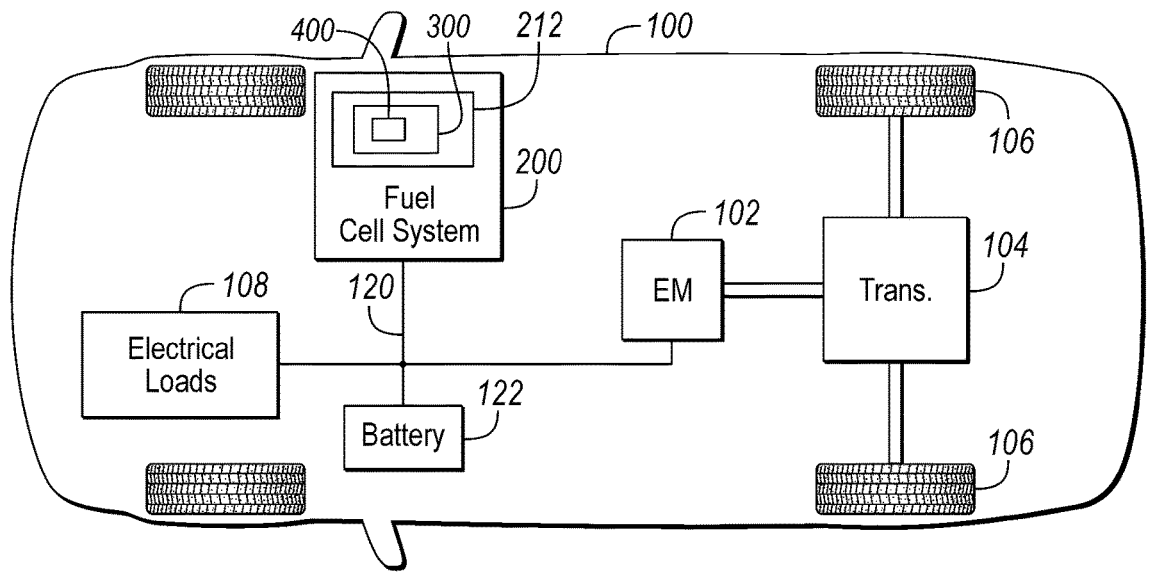
FIG. 1 illustrates a block diagram of a vehicle powered by a fuel cell system.

FIG. 1 depicts a diagram of a vehicle 100. The vehicle 100 may be powered by a fuel cell system 200. The fuel cell system 200 may be electrically coupled to a high-voltage bus 120. A traction battery 122 may be electrically coupled to the high-voltage bus 120. Electrical loads 108 may be electrically coupled to the high-voltage bus 120. An electric machine 102 may be electrically coupled to the high-voltage bus 120 via a power inverter. The electric machine 102 may be mechanically coupled to a transmission 104. The transmission 104 may be mechanically coupled to drive wheels 106 of the vehicle.

The fuel cell system 200 may provide electrical power to operate the electric machine 102 to propel the vehicle 100 or perform other vehicle functions. The fuel cell system 200 may generate electrical power that may be consumed by the components coupled to the high-voltage bus 120 (e.g., electrical loads 108). Electrical power generated by the fuel cell system 200 may also be stored by the traction battery 122. The electric machine 102 converts the electrical energy into rotational mechanical energy to drive the transmission 104. The transmission 104 may include gears and clutches that are configured to translate the rotational energy of the electric machine 102 into rotational energy at the drive wheels 106.

Figure 2:
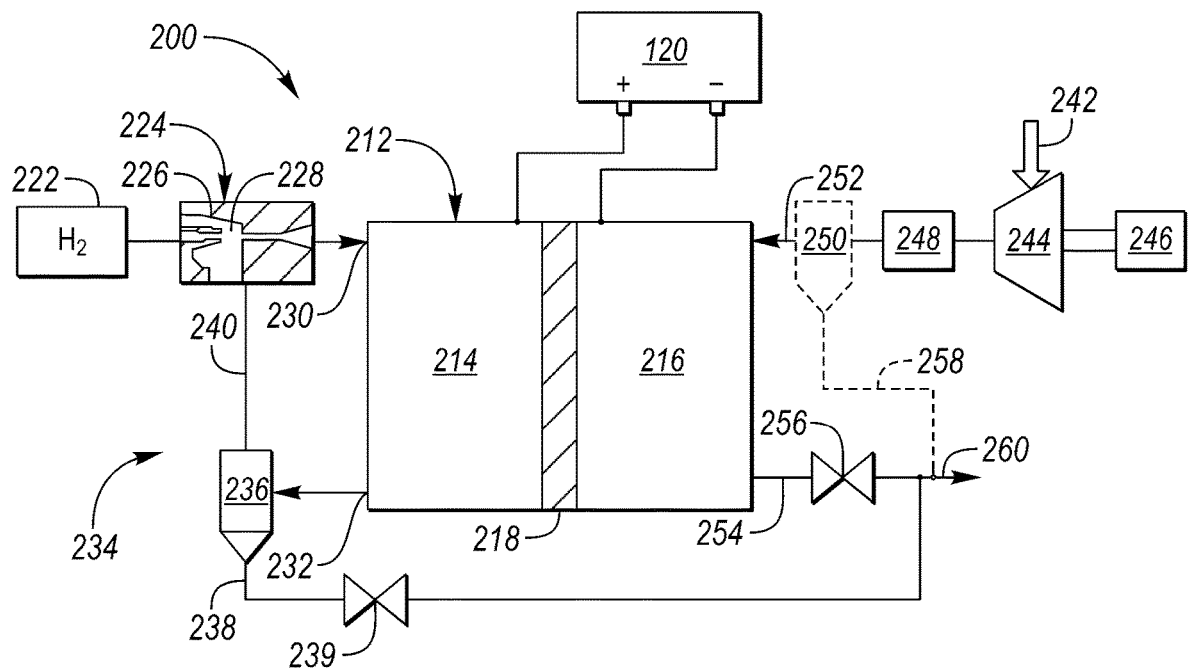
FIG. 2 illustrates a schematic of a fuel cell system according to an embodiment.

FIG. 2 illustrates one possible configuration of the fuel cell system 200 as a process flow diagram. The fuel cell system 200 may be a proton exchange membrane fuel cell (PEMFC) as is known in the art. The fuel cell system 200 may contain a fuel cell stack 212. The stack 212 may be comprised of a plurality of fuel cells coupled in series and/or parallel, or some combination thereof. The fuel cells of the stack 212 may include an anode side 214, a cathode side 216, and a membrane 218 therebetween. Note that reference to the anode side 214 and the cathode side 216 refers to the anode and cathode of each of the fuel cells. The fuel cell system 200 may electrically communicate with and provide energy, for example, to the high voltage bus 120 or the traction battery 122. The fuel cell stack 212 may also have a cooling loop (not shown).

During operation of the fuel cell system 200, water, residual fuel such as hydrogen, and byproducts such as nitrogen, may accumulate at the anode side. The fuel cell system 200 may be configured to remove the liquid water and byproducts and to reuse the residual hydrogen and water vapor. One approach may be to collect those constituents in a separator 236 downstream of the fuel cell stack 212 that is configured to separate at least a portion of the liquid water and/or nitrogen and return the remaining constituents to the fuel cell stack 212 via a return passageway in a recirculation loop.

A primary fuel source 222, such as a primary hydrogen source, may be connected to the anode side 214. Non-limiting examples of the primary hydrogen source 222 may include a high-pressure hydrogen storage tank or a hydride storage device. The hydrogen source 222 may be connected to one or more ejectors 224. The ejector 224 may have a nozzle 226 supplying hydrogen into the converging section of a converging-diverging nozzle 228. The diverging section of the nozzle 228 may be connected to the input 230 of the anode side 214.

The output 232 of the anode side 214 may be connected to a passive recirculation loop 234. Typically, an excess of hydrogen gas is provided to the anode side 214 to ensure that there is sufficient hydrogen available to all the cells in the stack 212. In other words, hydrogen is provided to the fuel cell stack 212 above a stoichiometric ratio of one, i.e. at a fuel rich ratio relative to exact electrochemical needs. The recirculation loop 234 is provided such that excess hydrogen unused by the anode side 214 is returned to the input 230 so the excess may be used and not wasted.

Additionally, accumulated liquid and vapor phase water is an output of the anode side 214. The anode side 214 requires humidification for efficient chemical conversion and to extend membrane life. The recirculation loop 234 may be used to provide water to humidify the hydrogen gas before the input 230 of the anode side 214.

The recirculation loop 234 may include the separator 236, or water knock-out device. The separator 236 receives a stream or fluid mixture of hydrogen gas, nitrogen gas, and water from the output 232 of the anode side 214. The water may be mixed phase and contain both liquid and vapor phase water. The separator 236 may include a reservoir for holding a predetermined volume of water. The separator 236 removes at least a portion of the liquid phase water, which may exit the separator through drain line 238. At least a portion of the nitrogen gas, hydrogen gas, and vapor phase water may also exit the drain line 238, and pass through a control valve 239 (may also be referred to as a drain valve), for example, during a purge process of the fuel cell stack 212. The control valve 239 may be closely integrated with the separator 236. The remainder of the fluid in the separator 236 exits through passageway 240 in the recirculation loop 234, which is connected to the ejector 224. The fluid in passageway 240 is fed into the converging section of the converging-diverging nozzle 228 where it mixes with incoming hydrogen from the nozzle 226 and hydrogen source 222.

Liquid water may be removed from the anode side 214 by the separator 236 to prevent water blockages within the channels and cells of the anode side 214. Water blockages within the fuel cell stack 212 may lead to decreases in cell voltage and/or voltage instabilities within the fuel cell stack 212. Liquid water may also be removed by the separator 236 to prevent a blockage or partial blockage within the ejector 224. A liquid water droplet in the diverging section of the converging-diverging nozzle 228 would effectively create a second venturi section within the nozzle 228 and lead to pumping instabilities for the ejector 224.

The cathode side 216 receives oxygen, for example, as a constituent in an air source 242. In one embodiment, a compressor 244 is driven by a motor 246 to pressurize the incoming oxygen. The pressurized air is then humidified by a humidifier 248 before entering the cathode side 216. Another separator 250 (shown in phantom) may be positioned downstream of the humidifier 248. The separator 250 may be used to remove liquid water from the humidified air flow before it enters the cathode side 216 at input 252. Water droplets may be present downstream of the humidifier 248 due to liquid water being entrained by air high flow rates within the humidifier 248. Liquid water may be removed by the separator 250 to prevent water blockages within the cells of the cathode side 216, leading to decreases in cell voltage and/or instabilities within the fuel cell stack 212. The cathode stack outlet 254 of the cathode side 216 is connected to a valve 256. Drain line 238 from separator 236, and a drain line 258 from separator 250 may be connected to a line 260 downstream of the valve 256. In other embodiments, the drain lines may be plumbed to other locations in the fuel cell system 200.

Other system architectures may also be used for the fuel cell system 200. For example, a turbine may be used in addition to the compressor 244 to induce flow through the cathode side 216. In one example, a turbine is positioned downstream of the cathode stack outlet 254, with a separator interposed between the cathode side 216 and the turbine to remove liquid water before the fluid stream enters the turbine.

Based on the use of the ejector 224 to create flow through the anode side 214 and induce flow through the passive recirculation loop 234, the ejector 224 must overcome any pressure drops in the system, which includes a typically significant pressure drop across the fuel cell stack 212. The system 200 as shown does not include a pump or other device to induce flow in the recirculation loop 234, therefore all the compression work is accomplished by the ejector, otherwise described as a jet pump. To enable this function, the separator 236 may have a low pressure drop across it. The separator 236 may be configured to remove larger droplets of water from the fluid to prevent water blockages in the recirculating flow in the fuel cell stack 212 or ejector 224 caused by droplets. The separator 236 permits vapor phase water and smaller water droplets to remain in the recirculating flow in passageway 240 and return to the ejector 224 for humidification purposes. In one example, the separator 236 removes water droplets having a diameter on the order of one millimeter or larger.

Additionally, as the separator 236 receives fluid flow from the anode side 214, the separator 236 may be designed for use with hydrogen gas. Generally, hydrogen gas may cause material degradation or embrittlement issues and material used in the separator 236 may be hydrogen compatible. Additionally, hydrogen is a small molecule, and many conventional separator devices are not suitable for use with hydrogen because their design may permit leaks, for example, with a conventional threaded connection. Other conventional separators may contain rotating or moving parts, such as a rotating vane, or the like, which may not be compatible with hydrogen as the lubricant may poison the fuel cell stack, or the hydrogen may degrade or decompose the lubricant.

The separator 250 may be configured to remove larger droplets of water from the fluid to prevent water blockages caused by droplets in the flow in the cathode side 216. The separator 250 permits vapor phase water, and smaller water droplets to remain in the flow for humidification. In some configurations, the separator 250 removes water droplets that are the same size or larger than the cathode side 216 flow field channel widths. In one example, the cathode side flow field channels may be between 0.2 and 1.0 millimeters.

Figure 3:
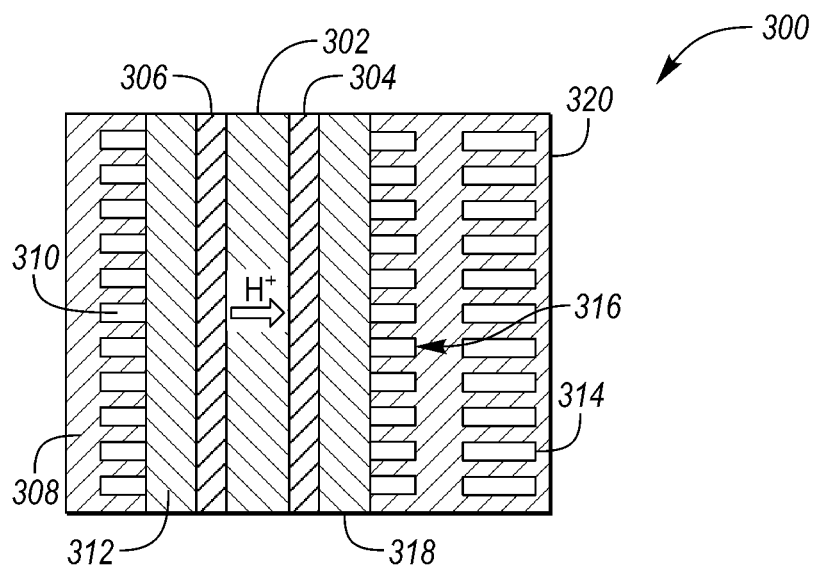
FIG. 3 depicts a fuel cell.

FIG. 3 depicts a possible structure for a PEMFC 300. The PEMFC 300 may include a proton exchange membrane (PEM) 302. On a first side of the PEM 302, there may be a layer of anode catalyst 306. The anode catalyst 306 may include a carbon-based structure that includes a catalyst material (e.g., Platinum). Adjacent to the layer of anode catalyst 306 may be an anode gas diffusion layer 312. On a second side of the PEM 302, there may be a layer of cathode catalyst 304. The cathode catalyst 304 may include a carbon-based structure that includes a catalyst material (e.g., Platinum). Adjacent to the layer of cathode catalyst 304 may be a cathode gas diffusion layer 318. The PEM 302 may be disposed between the anode catalyst layer 306 and the cathode catalyst layer 318.

Adjacent to the anode gas diffusion layer 312 may be an anode bipolar plate 308. Adjacent to the cathode gas diffusion layer 318 may be a cathode bipolar plate 320. The anode bipolar plate 308 and the cathode bipolar plate 320 may be configured to provide several functions. The plates may be configured to distribute hydrogen and air, remove heat, flow electrical current to other cells or a load. The plates may also be configured to prevent leakage of gas and fluids that are passing through.

The anode catalyst layer 306, the anode gas diffusion layer 312 and the anode bipolar plate may be referred to collectively as the anode and/or anode side. The cathode catalyst layer 304, the cathode gas diffusion layer 318 and the cathode bipolar plate 320 may be referred to collectively as the cathode and/or cathode side.

The anode bipolar plate 308 may define a plurality of hydrogen flow channels 310. The hydrogen flow channels 310 may be adjacent to the anode gas diffusion layer 312 and be configured to flow hydrogen gas. The hydrogen flow channels 310 may be configured so that hydrogen gas flowing therethrough is in contact with the anode gas diffusion layer 312. The hydrogen flow channels 310 of the anode bipolar plate 308 of each of the fuel cells that comprise the fuel cell stack 212 may be coupled together. In this manner, supplying hydrogen to the anode side 214 supplies hydrogen to each of the fuel cells in the stack 212.

The cathode bipolar plate 320 may define a plurality of air flow channels 316. The air flow channels 316 may be adjacent to the cathode gas diffusion layer 318 and be configured to flow air. The air flow channels 318 may be configured so that air flowing therethrough is in contact with the cathode gas diffusion layer 318. The cathode bipolar plate 320 may also define a plurality of cooling channels 314. The cooling channels 314 may be configured to flow coolant for maintaining a temperature of the fuel cell system. The air flow channels 318 of the cathode bipolar plate 320 of each of the fuel cells that comprise the fuel cell stack 212 may be coupled together. In this manner, providing air to the cathode side 216 supplies air to each of the fuel cells in the stack 212. The cooling channels 314 of the cathode bipolar plate 320 of each of the fuel cells that comprise the fuel cell stack 212 may be coupled together. In this manner, providing coolant to the cathode side 216 supplies coolant to each of the fuel cells in the stack 212.

During operation of the fuel cell 300, hydrogen gas may be flowed through the anode and air may be flowed through the cathode. The air and hydrogen gas may be pretreated so that the resulting flow is within predetermined temperature and humidity ranges. Operation of the fuel cell 300 causes various chemical reactions within the fuel cell 300. The chemical reactions result in a flow of ions and electrons through the fuel cell 300. The normal reaction on the anode side may be expressed as:

$$H_2 \rightarrow 2H^+ + 2e^- \qquad (1)$$

The reaction in the anode results in hydrogen gas being separated into hydrogen ions and electrons. The normal reaction in the cathode may be expressed as:

$$\tfrac{1}{2}O_2 + 2H^+ + 2e^- \rightarrow H_2O \qquad (2)$$

The reaction in the cathode results in water being formed. The water may flow within the air flow channels 316. The fuel cell system may provide various measures to maintain the flow of water through the fuel cell 300.

The reaction in the cathode requires the hydrogen ions from the anode. The hydrogen ions may pass through the PEM 302 in order to move from anode to cathode to feed the reaction. The electrons may flow around the PEM 302 through an external circuit. The PEM 302 may be configured such that electrons do not flow through. During normal operation, the reactions continue while hydrogen gas and air are provided to the fuel cell 300.

A fuel cell stack may be comprised of a plurality of fuel cells 300 arranged in series and/or parallel. The fuel cells 300 may be arranged such that the cathodes and anodes of adjacent fuel cells are in contact with one another. The fuel cell 300 may be configured to provide a predetermined voltage level. For example, if each fuel cell 300 provides 1V, a fuel cell stack comprised of one hundred fuel cells 300 arranged in series, may provide an output voltage of 100V. So long as hydrogen and air are provided in sufficient amounts to each of the fuel cells 300, the reaction may continue and the rated output voltage may be achieved.

However, under some conditions, one or more of the fuel cells 300 may experience reduced operating conditions. Under some conditions, one or more of the fuel cells 300 may experience a voltage reversal. A voltage reversal may be a condition in which the voltage across the fuel cell 300 changes polarity relative to the rest of the fuel cells in the fuel cell stack. Such conditions may be caused by insufficient hydrogen, insufficient air, insufficient water, and/or fuel cell temperature being out of a specified operating range. Such conditions may be present at some of the fuel cells such that not all of the fuel cells are affected.

For example, an absence of $O_2$ in the cathode causes a condition in which $2H^++2e^-$ is greater than the amount of $H_2$ that occurs during the normal Oxygen Reduction Reaction (ORR). During this condition, the fuel cell 300 operates like a hydrogen pump. Voltage reversal in this case is rather small. Other conditions may cause more serious problems for the fuel cell 300. A more serious condition involves the anode being starved of hydrogen which can cause carbon corrosion.

Anode fuel starvation may be caused by water droplets in the intake manifold. Current flow cannot occur as there may be insufficient $H_2$ such that the normal hydrogen oxidation reaction (HOR) does not occur. The anode then cannot create enough hydrogen ions to pass through to the cathode to support the flow of current. To maintain the current required by the remaining fuel cells and the load, water electrolysis and carbon corrosion occurs.

The voltage reversed cell exhibits higher potential at the anode than at the cathode. That is, a negative cell voltage occurs. The voltage reversal can be in the range of –1V when a majority of the current is carried by water electrolysis. When electrolysis cannot support the current, the cell voltage can drop well below –1V. The voltage drop is theoretically limited by the voltage of the remaining cells in the stack. During this condition, carbon corrosion becomes a major concern.

The starting voltage for cell voltage reversal may be determined for different fuel cell reactions. The starting voltage are in comparison to a reversible hydrogen electrode (RHE) that is used as a reference. At the anode in the presence of a lack of Hydrogen, the Oxygen Evolution Reaction (OER) from water electrolysis results in a reaction and voltage as follows:

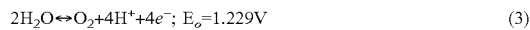

$$2H_2O \leftrightarrow O_2+4H^++4e^-; E_o=1.229V \qquad (3)$$

The carbon corrosion reactions that may occur and the associated voltages are as follows:

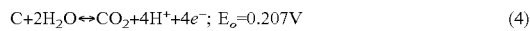

$$C+2H_2O \leftrightarrow CO_2+4H^++4e^-; E_o=0.207V \qquad (4)$$

$$C+H_2O \leftrightarrow 2H^++2e^-; E_o=0.518V \qquad (5)$$

The OER from water electrolysis may be thermodynamically unfavorable when compared to carbon oxidation. However, water electrolysis may be kinetically preferred to occur before carbon oxidation to reduce carbon corrosion. During voltage reversal, it is desired to support the reaction by water electrolysis. When water electrolysis can no longer be supported (e.g., lack of water) then current is supported by carbon corrosion. To facilitate water electrolysis, a reversal tolerant additive (RTA) may be incorporated into the anode catalyst 306. For example, $IrO_2$ or $RuO_2$ may be added into the anode catalyst 306. The RTA promotes water electrolysis and may reduce carbon corrosion.

The above strategies attempt to minimize degradation of the fuel cell due to voltage reversals. The above approaches generally attempt to cause a reaction to continue supporting the current flow through the membrane of the fuel cell. A preferred strategy may be to implement a power semiconductor switch into individual fuel cells to limit that anode cell reversal to minimize or eliminate carbon corrosion of the anode catalyst support. Such a strategy may extend the useful service life of the fuel cell stack.

A semiconductor switch may be configured to conduct current in response to a voltage reversal across the fuel cell 300. The semiconductor switch may be switched on to support current flow across the fuel cell 300. By flowing current through the semiconductor switch, the chemical reactions in the fuel cell 300 may be reduced. As a result, carbon corrosion reactions are not needed to support current flow across the affected fuel cell. The semiconductor switch may include load terminals that are respectively electrically coupled to one of the bipolar plates. The semiconductor switch may include a gate terminal for causing the semiconductor switch to transition between a conducting state and a non-conducting state. Operation of the semiconductor switch includes biasing the gate terminal (e.g., applying a voltage or current with a specified polarity) to cause the semiconductor switch to conduct or block current between the load terminals. The bias may be with respect to one of the load terminals. For example, a voltage for biasing the gate may be a voltage between the gate terminal and one of the load terminals. The voltage or current levels for biasing the gate may depend upon the specific type of semiconductor switch that is selected.

The power semiconductor switch may include metal-oxide semiconductor field-effect transistors (MOSFET) and insulated gate bipolar transistors (IGBT). For example, the semiconductor switch may be a MOSFET-based transistor device. The semiconductor switching device may be configured to conduct responsive to a reverse voltage of 0.1V and have a current density of 50 A/cm$^2$. The semiconductor switching device may be configured to have a voltage drop across the load terminals of no more than 0.1 Volts when the semiconductor switching device is conducting current between the load terminals. A representative device may be an LX2410 produced by Microsemi Corporation. The device may be configured as a current bypass device (CBD) to conduct 100 A to 800 A of current by connecting the devices in parallel. In other configurations, the device may be sized to handle a desired level of current. For example, a CBD having dimensions of 60 mm×60 mm×1 mm may allow over 800 A of current to pass when there is a voltage reversal.

Upon fuel cell voltage reversal, the CBD may switch instantaneously and pass the current flowing through the fuel cell stack until the cell recovers to normal operating voltage levels. The CBD system can operate reversibly without causing carbon corrosion in the fuel cells. That is, the CBD may be operated repeatedly without contribution to carbon corrosion in the fuel cell.

Figure 4:
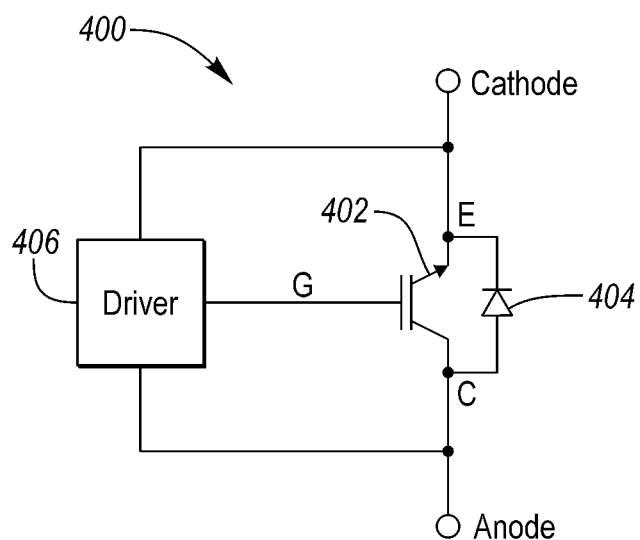
FIG. 4 depicts an electrical schematic for a current bypass device for a fuel cell.

FIG. 4 depicts an electrical schematic for a possible semiconductor switch that may be used for a CBD 400. For example, an IGBT 402 may be arranged in a circuit such that an emitter terminal is connectable to the cathode of the fuel cell and a collector terminal is connectable to the anode of the fuel cell. A bypass diode 404 may be coupled across the emitter terminal and the collector terminal. A driver circuit 406 may be implemented that drives the gate of the IGBT 402. The driver circuit 406 may be configured to operate based on the relative voltage across the IGBT 402. In other configurations, the driver circuit 406 may be powered from an external source. For example, the driver circuit 406 may receive power from a low-voltage bus and/or a battery. When the voltage at the cathode exceeds the voltage at the anode, the fuel cell may be operating normally. As such, the driver circuit 406 may maintain the IGBT 402 in an off or non-conducting state. That is, no current may be allowed to flow through the IGBT 402. When the cathode voltage becomes less than the anode voltage, as may occur during a fuel cell voltage reversal, the driver circuit 406 may operate the IGBT 402 in a conducting state. The driver circuit 406 may be configured to, responsive to a potential of the anode exceeding a potential of the cathode, bias the gate terminal to cause current to conduct between the bipolar plates through the IGBT 402. In the conducting state, current flow may be allowed from the source terminal to the drain terminal (e.g., load terminals). The driver circuit may be powered by the fuel cell and be configured to draw only a small amount of power to operate. For example, the driver circuit 406 may be comprised of a resistive network that biases the gate voltage such that during a voltage reversal there is sufficient voltage at the gate of the IGBT 402 to transition to the conducting state. In some configurations, an n-channel MOSFET may be substituted for the IGBT 402 such that a source terminal of the MOSFET is connectable to the anode and a drain terminal of the MOSFET is connectable to the cathode.

Figure 5:
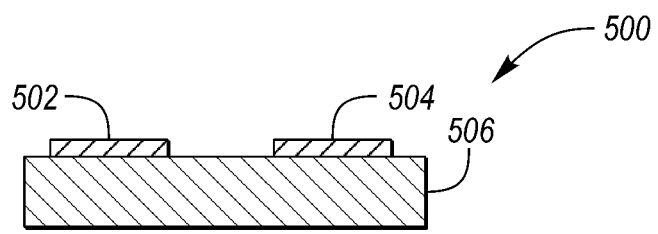
FIG. 5 depicts a possible configuration for the current bypass device.

The CBD 400 may be implemented as single semiconductor device. For example, FIG. 5 depicts a possible configuration of a single CBD 500. The integrated CBD 500 may include a housing 506 in which the semiconductor device resides. For example, the CBD 400 depicted in FIG. 5 may be implemented as an integrated circuit and disposed within the housing 506. The integrated CBD 500 may include a conductive anode terminal 502 and a conductive cathode terminal 504. For example, the conductive anode terminal 502 may be electrically coupled to the collector terminal of IGBT 402 and the conductive cathode terminal 504 may be the emitter terminal of the IGBT 402.

The maximum current carrying capacity of the CBD may depend upon a rated current of the fuel cell stack. The maximum current capability of the CBD may be at least the rated operating current of the fuel cell stack. The CBD may be designed such that a single integrated circuit implements the CBD function. As the current carrying capacity increases, the size of the single integrated circuit may increase accordingly to support the current flow. In other configurations, CBD devices may be coupled in parallel to support the current carrying capacity. Each CBD device may be configured to carry a portion of the current flowing. Such a design may allow for lower current rated CBDs to be used. Paralleling the CBDs may also permit existing CBDs to be combined to achieve the desired current capacity. Current capacity may be selectively configured to each fuel cell stack application by adding or removing CBDs.

Figure 6:
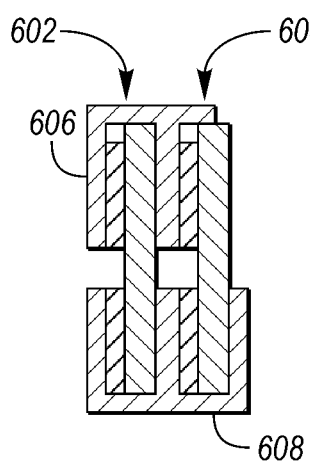
FIG. 6 depicts a possible configuration for coupling current bypass devices in parallel.

FIG. 6 depicts an example of a paralleled CBD 600. The paralleled CBD 600 may include a first CBD 602 and a second CBD 604. The first CBD 602 and the second CBD 604 may be as described in relation to FIG. 6. An anode connector 606 may be configured to electrically couple the anode terminals of the first CBD 602 and the second CBD 604. A cathode connector 608 may be configured to electrically couple the cathode terminals of the first CBD 602 and the second CBD 604. The anode connector 606 and the cathode connector 608 may be constructed of a conductive material such as copper. As depicted, the cathode connector 608 may further extend around the second CBD 604 to form a conductive surface. Note that in FIG. 6 additional CBDs may be added in parallel in a similar manner. That is, the anode connector 606 and cathode connector 608 may be adapted such that additional CBDs are added in parallel. Additional CBDs may be added to increase the current carrying capacity.

The anode connector 606 and the cathode connector 608 may be configured to secure the individual CBDs together as a unit. For example, the anode connector and/or the cathode connector 608 may be configured as clips that provide a holding force to the CBDs. In other configurations, an additional nonconductive clip may be used to provide a holding force to maintain the CBDs in place. In other configurations, the CBDs may be secured as a unit using an epoxy.

Figure 7:
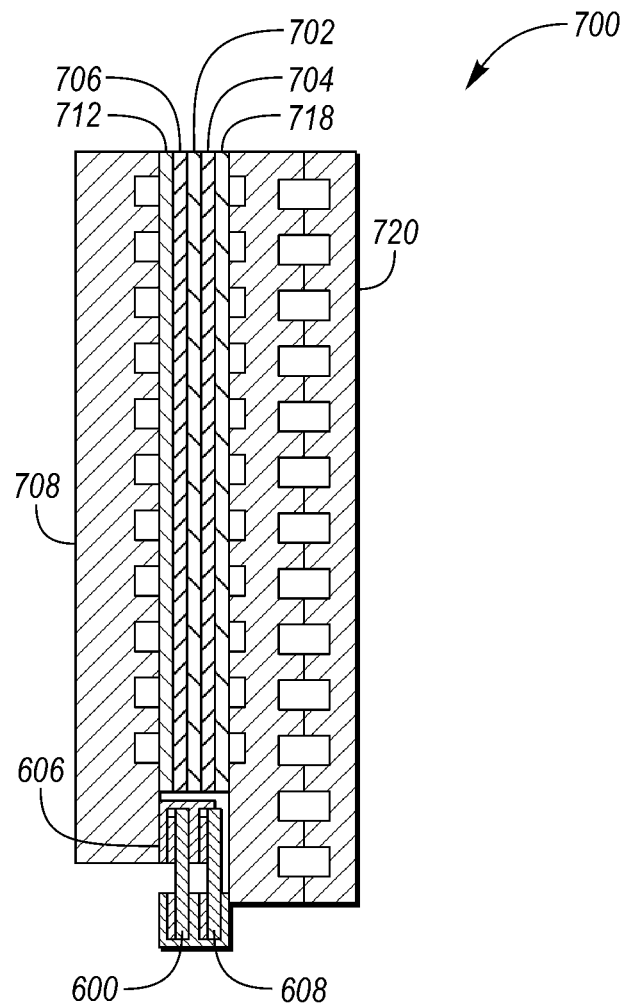
FIG. 7 depicts a fuel cell with an integrated current bypass device.

FIG. 7 depicts a fuel cell 700 integrated with the CBD 600 of FIG. 6. The fuel cell 700 may be constructed similar to that of FIG. 3. The fuel cell 700 may include a proton exchange membrane (PEM) 702. On a first side of the PEM 702, there may be a layer of anode catalyst 706. Adjacent to the layer of anode catalyst 706 may be an anode gas diffusion layer 712. On a second side of the PEM 702, there may be a layer of cathode catalyst 704. Adjacent to the layer of cathode catalyst 704 may be a cathode gas diffusion layer 718. The PEM 702 may be disposed between the anode catalyst layer 706 and the cathode catalyst layer 704.

Adjacent to the anode gas diffusion layer 712 may be an anode bipolar plate 708. Adjacent to the cathode gas diffusion layer 718 may be a cathode bipolar plate 720. The anode bipolar plate 708 and the cathode bipolar plate 720 may include features as described in relation to FIG. 3. In the configuration shown, the CBD is sandwiched between the anode bipolar plate 708 and the cathode bipolar plate 720.

The CBD 600 may be disposed between the anode bipolar plate 708 and the cathode bipolar plate 720. The CBD 600 may be installed such that the anode connector 606 is in electrical contact with the anode bipolar plate 708 and the cathode connector 608 is in electrical contact with the cathode bipolar plate 720. Other configurations are possible in which the cathode bipolar plate 720 is electrically connected to the cathode connector 608 and the anode bipolar plate 708 is electrically connected to the anode connector 606.

During normal operation of the fuel cell 700, the cathode bipolar plate 720 is at a greater electrical potential than the anode bipolar plate 708. Under this condition, the CBD 600 is in a nonconducting state and current does not flow through the semiconductor switching device. Current flow through the fuel cell 700 is achieved by flow of hydrogen ions. During conditions in which a voltage reversal is present in the fuel cell 700, the anode bipolar plate 708 is at a greater electrical potential than the cathode bipolar plate 720. As described previously, carbon corrosion of the fuel cell 700 may occur during this condition. In response to the electrical potential of the anode bipolar plate 708 (anode potential) becoming greater than the electrical potential of the cathode bipolar plate 720 (cathode potential), the CBD 600 transitions to a conducting state. In the conducting state, the CBD 600 allows current to flow from the anode bipolar plate 708 to the cathode bipolar plate 720 through the semiconductor switching device. This permits the current to flow through the fuel cell stack without contributing to carbon corrosion. When the voltage reversal ceases, the semiconductor switching devices is caused to operate in a nonconducting state so that no current flows therethrough.

Figure 8:
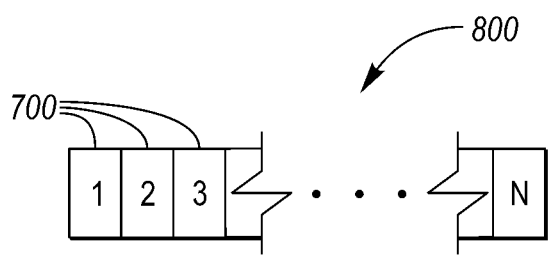
FIG. 8 depicts a possible fuel cell stack using fuel cells with the integrated current bypass device.

FIG. 8 depicts a diagram of a fuel cell stack 800 that is comprised of N fuel cells 700 that include the CBD 600. The fuel cell stack 800 may be constructed by coupling N fuel cells 700 in series. For example, the anode side of each fuel cell 700 may be electrically coupled to the cathode side of an adjacent fuel cell. The cathode side of each fuel cell 700 may be electrically coupled to the anode side of an adjacent fuel cell on the opposite side. In this manner, the fuel cell stack 800 may create a voltage output that is the sum of the individual fuel cell voltages. Note that other configurations are possible. For example, additional fuel cells may be added in parallel with each of the individual fuel cells.

During operation, the fuel cells 700 are operated and generate a voltage. An electrical load draws current from the fuel cell stack 800 as needed. Current may pass through the fuel cell stack 800. Under normal operating conditions, each of the fuel cells 700 cathode electrical potential is greater than the anode electrical potential. Current flow through the fuel cells 700 is supported by the flow of hydrogen ions within the fuel cells 700. When one or more of the cells experiences a voltage reversal, the chemical reactions may be become changed within those cells leading to potential carbon corrosion. By integrating the CBD 600 within each of the fuel cells 700, the current flow may be maintained by electrical means during the voltage reversal. The CBD 600 enables current flow to bypass the fuel cell that is experiencing a voltage reversal. That is, the CBD 600 provides a path for electrons to flow through the semiconductor switching device during the voltage reversal condition. This allows current to flow around the affected fuel cell and maintain the current flow without degrading the fuel cell. The CBD 600 effectively provides a current path across the fuel cell during a voltage reversal condition. Operation of the fuel cell 700 in this manner reduces degradation that may occur during these conditions. When operating conditions return to normal, the CBD 600 transitions back to the nonconducting state and the fuel cell 700 may operate normally again.

The current bypass device effectively prevents carbon corrosion in fuel cells. The current bypass device provides a solution for voltage reversal that can improve durability and life of the fuel cell. In addition, by allowing current flow at the onset of the voltage reversal, carbon corrosion can be minimized.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A fuel cell comprising:
an anode and cathode each having a corresponding bipolar plate; and
at least one semiconductor switch having a gate terminal, and load terminals respectively electrically coupled to one of the bipolar plates; and
a circuit configured to, responsive to a potential of the anode exceeding a potential of the cathode, bias the gate terminal to cause current to conduct between the bipolar plates through the semiconductor switch,
wherein the at least one semiconductor switch is configured to have a voltage drop across the load terminals of no more than 0.1 Volts when the gate terminal is biased to cause current to conduct between the load terminals.

2. The fuel cell of claim 1 wherein the semiconductor switch is an insulated gate bipolar transistor (IGBT).

3. The fuel cell of claim 1 wherein the semiconductor switch is a metal oxide semiconductor field-effect transistor (MOSFET).

4. The fuel cell of claim 1 wherein the at least one semiconductor switch is comprised of a plurality of semiconductor switching devices coupled in parallel.

5. The fuel cell of claim 1 wherein the at least one semiconductor switch is configured to have a current density of at least 50 A/cm$^2$ in a conducting state.

6. The fuel cell of claim 1 wherein the circuit is powered by a voltage across the bipolar plates.

7. The fuel cell of claim 1 wherein the circuit is further configured to bias the gate terminal to cause current flow through the semiconductor switch to be blocked responsive to the potential of the cathode exceeding the potential of the anode.

8. A fuel cell stack comprising;
a plurality of fuel cells, each having an anode bipolar plate, a cathode bipolar plate, at least one semiconductor switching device, and a circuit configured to, responsive to an anode potential becoming greater than a cathode potential, bias a gate of the semiconductor switching device to conduct current from the anode bipolar plate to the cathode bipolar plate through the at least one semiconductor switching device, wherein the at least one semiconductor switching device is configured to have a maximum current capability that is at least a rated operating current of the fuel cell stack.

9. The fuel cell stack of claim 8 wherein the circuit is further configured to, responsive to the cathode potential becoming greater than the anode potential, bias the gate of the at least one semiconductor switching device to block current flow through the at least one semiconductor switching device.

10. The fuel cell stack of claim 8 wherein the at least one semiconductor switching device is an insulated gate bipolar transistor (IGBT).

11. The fuel cell stack of claim 8 wherein the at least one semiconductor switching device is a metal oxide semiconductor field-effect transistor (MOSFET).

12. The fuel cell stack of claim 8 wherein the at least one semiconductor switching device is comprised of a plurality of semiconductor switching devices coupled in parallel.

13. The fuel cell stack of claim 8 wherein the circuit is further configured to be powered by a voltage across the anode bipolar plate and the cathode bipolar plate.

14. A vehicle comprising:
a fuel cell stack including a plurality of fuel cells, each of the fuel cells including at least one semiconductor switch and a circuit configured to, responsive to a potential of an anode becoming greater than a potential of a cathode, bias a gate of the at least one semiconductor switch to enter a conducting state to conduct current from the anode to the cathode of the corresponding fuel cell, wherein the at least one semiconductor switch is configured to have a maximum current capability that is at least a rated operating current of the fuel cell stack.

15. The vehicle of claim 14 wherein the circuit is further configured to, responsive to the potential of the cathode becoming greater than the potential of the anode, bias the gate of the at least one semiconductor switch to enter a nonconducting state to block current flow through the at least one semiconductor switch.

16. The vehicle of claim 14 wherein the circuit is further configured to be powered by a voltage across the anode and cathode of the corresponding fuel cell.

17. The vehicle of claim 14 wherein the at least one semiconductor switch is comprised of a plurality of semiconductor switches arranged in parallel.

* * * * *